United States Patent
Guo et al.

(10) Patent No.: US 6,930,925 B2
(45) Date of Patent: Aug. 16, 2005

(54) SUSPEND-RESUME PROGRAMMING METHOD FOR FLASH MEMORY

(75) Inventors: Jason Xiaojiang Guo, San Jose, CA (US); Fai Ching, Fremont, CA (US)

(73) Assignee: Atmel Corporation, San Jose, CA (US)

( * ) Notice: Subject to any disclaimer, the term of this patent is extended or adjusted under 35 U.S.C. 154(b) by 80 days.

(21) Appl. No.: 10/685,752

(22) Filed: Oct. 14, 2003

(65) Prior Publication Data

US 2005/0078525 A1 Apr. 14, 2005

(51) Int. Cl.⁷ .............................................. G11C 16/00
(52) U.S. Cl. .................. 365/185.28; 365/233; 365/195
(58) Field of Search ....................... 365/185.28, 185.33, 365/233, 195

(56) References Cited

U.S. PATENT DOCUMENTS

| | | | |
|---|---|---|---|
| 5,287,469 A | 2/1994 | Tsuboi ........................ 395/425 |
| 5,355,464 A | 10/1994 | Fandrich et al. ............ 395/425 |
| 5,521,864 A | * 5/1996 | Kobayashi et al. .... 365/185.22 |
| 5,805,501 A | 9/1998 | Shiau et al. ........... 365/185.29 |
| 5,822,244 A | * 10/1998 | Hansen et al. ......... 365/185.11 |
| 5,937,424 A | 8/1999 | Leak et al. .................. 711/103 |
| 5,940,861 A | 8/1999 | Brown et al. ................ 711/154 |
| 6,148,360 A | 11/2000 | Leak et al. .................. 710/260 |
| 6,189,070 B1 | * 2/2001 | See et al. .................... 711/103 |

* cited by examiner

Primary Examiner—Tan T. Nguyen
(74) Attorney, Agent, or Firm—Schneck & Schneck; Thomas Schneck

(57) ABSTRACT

In a non-volatile memory, a programming cycle consists of the following phases: high voltage charging up, programming pulse, and discharge. The actual programming process only takes place in the programming pulse phase. Several break points are defined relative to elapsed time and introduced in the programming pulse phase. Upon receiving a suspend request, the programming operation will advance to the next break point, then discharge the high programming voltage and go to a suspend state. A separate counter is used to monitor the break points so that elapsed non-programming time can be deducted from the total programming pulse time when the programming operation is resumed. By doing so, the device can handle frequent suspend and resume requests. Since the total time duration in the programming pulse phase is equal for the programming operation with and without suspend and resume requests, the programming proceeds efficiently to completion.

17 Claims, 4 Drawing Sheets

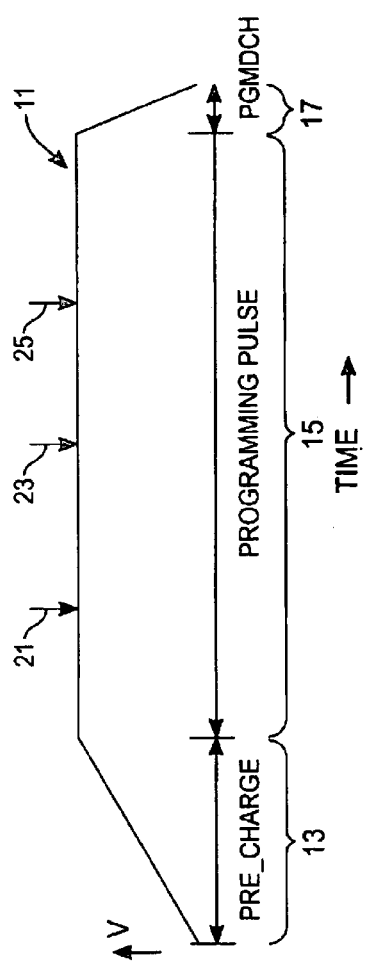
Fig._1
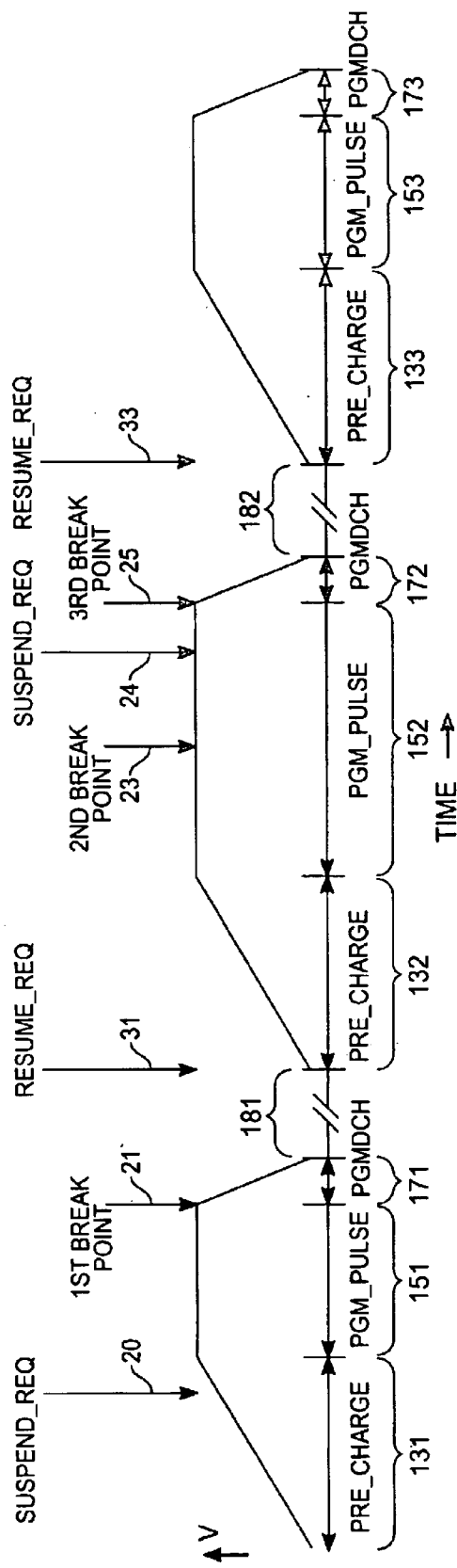
Fig._2

# SUSPEND-RESUME PROGRAMMING METHOD FOR FLASH MEMORY

TECHNICAL FIELD

The invention relates to programming non-volatile semiconductor flash memories and, in particular, to such programming with suspend and resume commands.

BACKGROUND ART

In programming or loading of non-volatile flash memories with data or programs, it is sometimes necessary to interrupt programming in order to read data. For example, the system may require data from the memory. Once the data is read, programming may resume.

Opcodes in the programming sequence will indicate suspend and resume requests for this purpose.

From U.S. Pat. No. 5,287,469 to T. Tsuboi it is known that as a data write or programming process is suspended, a programming timer is suspended and the programming voltage is halted. When the suspension is lifted, programming proceeds, with the programming timer active again. Of course, it is possible that a program will request very frequent data updates, requiring frequent suspension of the programming process. In this situation, the programming process may not finish or may experience long delays because on start of programming a pre-charge step is typical for set up. An object of the invention is to devise a programming process for a non-volatile memory wherein programming is subject to suspend requests but programming can be completed efficiently.

SUMMARY OF THE INVENTION

The above object is achieved by creating a programming technique in which suspend requests are received but programming continues nonetheless, at least for an interval. Time-based pre-defined break points are established within a programming pulse for a non-volatile memory. When a suspend request is received, the programming operation does not immediately stop, but proceeds to the next break point where the suspend request is executed. When a resume request is received, a program counter points to the next break point. If the programming cycle has proceeded in time past this break point, without a suspend request, the break point is ignored and the program counter points to the next further break point. When a suspend request is received programming continues to that break point. This procedure is repeated until the end of the programming pulse. Whenever a suspend request executed at a break point, the programming voltage is reduced and a timer clocks the elapsed-programming time. The timer does not count any time during the non-programming period. In this manner the timer counts the regular length of a programming step.

BRIEF DESCRIPTION OF THE DRAWINGS

FIG. 1 is a graph of programming voltage with respect to time without suspend requests for a non-volatile memory in accordance with the present invention.

FIG. 2 is a graph of programming voltage with respect to time, as shown in FIG. 1, but with suspend and resume requests.

DESCRIPTION OF THE INVENTION

Figure 3:
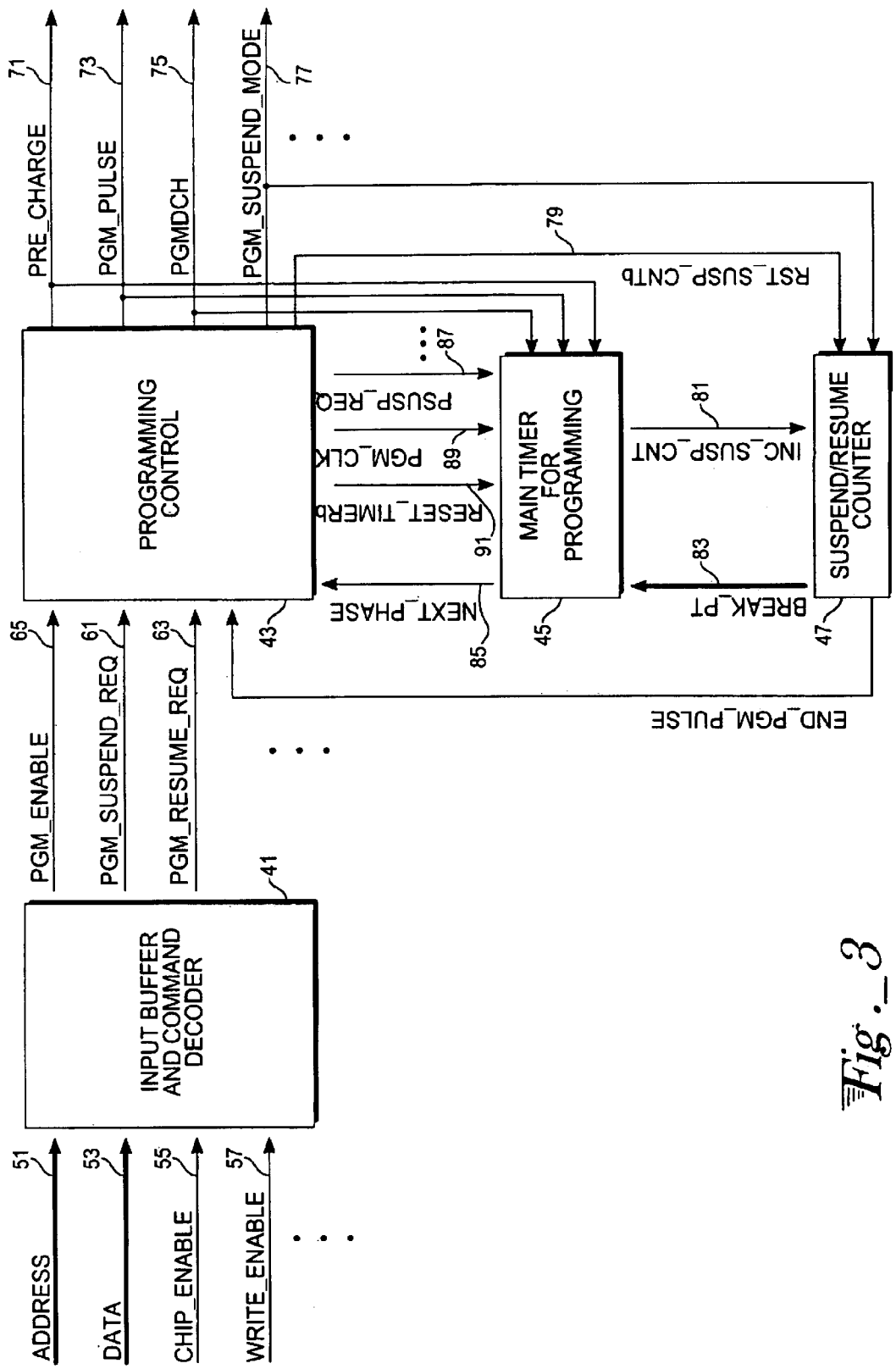
FIG. 3 is a block diagram of digital logic organization for implementing a suspend-resume procedure as shown in FIG. 2.

With reference to FIG. 1, a programming operation in a flash memory device is a relatively long operation, perhaps taking tens of micro seconds, as seen by pulse 11. The pulse consists at least the following phases: high voltage charging up, PRE_CHARGE voltage ramp 13, programming pulse, PGM_PULSE voltage level 15, and a discharge, PGMDCH voltage ramp pulse 17. In order to allow the system to quickly retrieve data, the programming operation can be temporarily suspended. Afterwards, programming may resume with a resume command. The present invention deals with the manner of implementing the suspend and resume operation using a series of time based break points 21, 23, and 25 that are pre-defined at selected locations. For example, the break points may evenly divide the programming pulse into intervals of equal time. Alternatively, the break points may be defined.

The user can input a programming suspend request any time during programming operation. The set of time-based break points 21, 23, and 25 are preset in the PGM_PULSE phase. There are break points only in the PGM_PULSE phase because this is the only phase during which actual programming takes place.

With reference to FIG. 2, upon receiving a suspend request 20, after charging up a PRE_CHARGE voltage ramp 131 has begun, the programming operation indicated by the level PGM_PULSE 151 will not stop immediately. Instead the programming operation will proceed to the next break point 21, then discharge the high voltage at level PGMDCH 171 and get into suspend mode represented by interval 181. A suspend/resume counter keeps track of which break point the suspend mode stops at. When the user issues a programming resume command 31, control logic will enable a programming main timer and the programming operation starts again from the PRE_CHARGE level. The duration of PGM_PULSE 152 phase is shortened depending on the pulse time represented by the level PGM_PULSE 151 that occurred before the device gets into previous suspend mode at the first break point 21. So the total pulse duration is the same for the programming operations with and without suspend, and the cell margins after programming are more uniform.

Even if a user issues a suspend request 20 at PRE_CHARGE level 131, the programming operation does not stop there. Otherwise a programming operation may never finish if the user frequently issues suspend and resume commands. Before the device gets into suspend mode 181, some of the actual programming is done on the device in the interval of level PGM_PULSE 151. So the device can successfully finish the programming operation after several consecutive suspend and resume loops.

After the first break point 21, the level PGM_PULSE 151 stops and the voltage discharge or PGMDCH level 171 starts and gets into suspend mode 181 after that. The main timer is reset but the suspend and resume counter does not get reset. A signal BREAK_PT<1> stays high. Later the user issues the resume commands at RESUME_REQ 31. To respond to this request, the programming control enables the main timer again, raising the programming voltage during precharge phase, the level PRE_CHARGE 132. The programming operation restarts during the interval and level PGM_PULSE 152. Then the user enters a suspend request indicated by SUSPEND_REQ 24 during PGM_PULSE phase 152 after the second break point 23. The programming control allows the PGM_PULSE phase 152 to continue until it reaches the next break point 25 which is the third one. Then the device starts a discharge phase, PGMDCH phase 172 and gets into a suspend mode afterwards, indicated by-interval 182.

Now a signal BREAK_PT<3> goes high to indicate programming operation stops at break point 25. Later the user inputs a resume command, indicated by RESUME_REQ 33. Then the programming control enables the main timer again and starts PRE_CHARGE phase 133 to restore the programming voltage whereupon programming may again begin, indicated by the level PGM_PULSE 153 until the total time of the programming pulse has elapsed. At this time, voltage is lowered in the interval PGMDCH 173 to complete the programming operation. Notice that PGM_PULSE duration is calculated so that deviations from programming time have been deducted from the total pulse time to keep the total PGM_PULSE duration the same as if no suspend request had been received.

With reference to FIG. 3, input buffer and command decoder ("IBCD") 41 functions to receive information externally from the system. The information typically includes address bits 51 on a data bus, data bits 53, also on a bus, a chip enable bit 55 and a write enable bit 57, plus other bits. A logic section of IBCD 41 examines these input bits and decodes them into different logical signals. For example, PGM_ENABLE signal 65 is asserted for program enable commands, PGM_SUSPEND_REQ signal 61 is asserted for a programming suspend request, and PGM_RESUME_REQ signal 63 is asserted for a programming resume request. These outputs are sent to programming control block 43 that generates logical signals to control different programming phases. As previously described, signal PRE_CHARGE 71 enables on-chip charge pumps and ramps up voltage; signal PGM_PULSE 73 enables actual programming; signal PGMDCH 75 stops the actual programming and discharges the high voltages. The actual duration of these phases are controlled by the main timer. Whenever the signal NEXT_PHASE signal 85 is asserted, the programming cycle will shift from the current phase to the next. PGM_SUSP_MODE indicates the flash memory device is in suspend mode and the system may begin to read out data from the flash device. The programming control unit 43 also generates the internal clocks PGM_CLK 89 to control the counts of main timer unit 45. The time base break points are also preset inside the main timer 45. The suspend/resume counter unit 47 stores the previous break point information which is important for determining the remaining time of programming pulse phase after the programming operation is resumed. This control is through the bus signal BREAK_PT 83 which contains a number of individual signals equal to the number of preset break points. The suspend/resume counter increments to the next break point upon receipt of an INC_SUSPCNT signal on line 81 from main counter 45. Signal INC_SUSPCNT is asserted every time the main timer counts to the break point. The programming control unit 43 asserts a signal PSUSP_REQ 87 if a suspend request is received. The main timer 45 will continue to count to the next break point, and then issue the NEXT_PHASE pulse on line 85. This signal tells the programming control unit 43 the current program pulse phase can stop. In turn, unit 43 will reset the timer by a low pulse RESET_TIMERb and issue the signal PGMDCH to discharge the program voltage. After this phase finished, the flash array is ready for the read operation and signal PGM_SUSPEND_MODE is asserted. Upon receiving the resume program opcode signal, PGM_RESUME_REQ 63 is asserted. Through the signal RESET_TIMERb 91 and PGM_CLK 89, programming control unit 43 will start the main timer again. If there is another suspend request, the process will repeat itself as mentioned above and next BREAK-PT signal will be set. If there is no further suspend request, the timer will count to finishing point. This finishing point depends on the status of signals on the BREAK_PT bus. The position of the finishing point will make the total duration of program pulse a constant regardless number of suspensions. When the finishing point is reached, the control unit 43 generates signal RST_TIMERb 91 and signal RST_SUSP_CNTb 79 to reset the main timer 45 and the counter unit 47, respectively.

Figure 4:
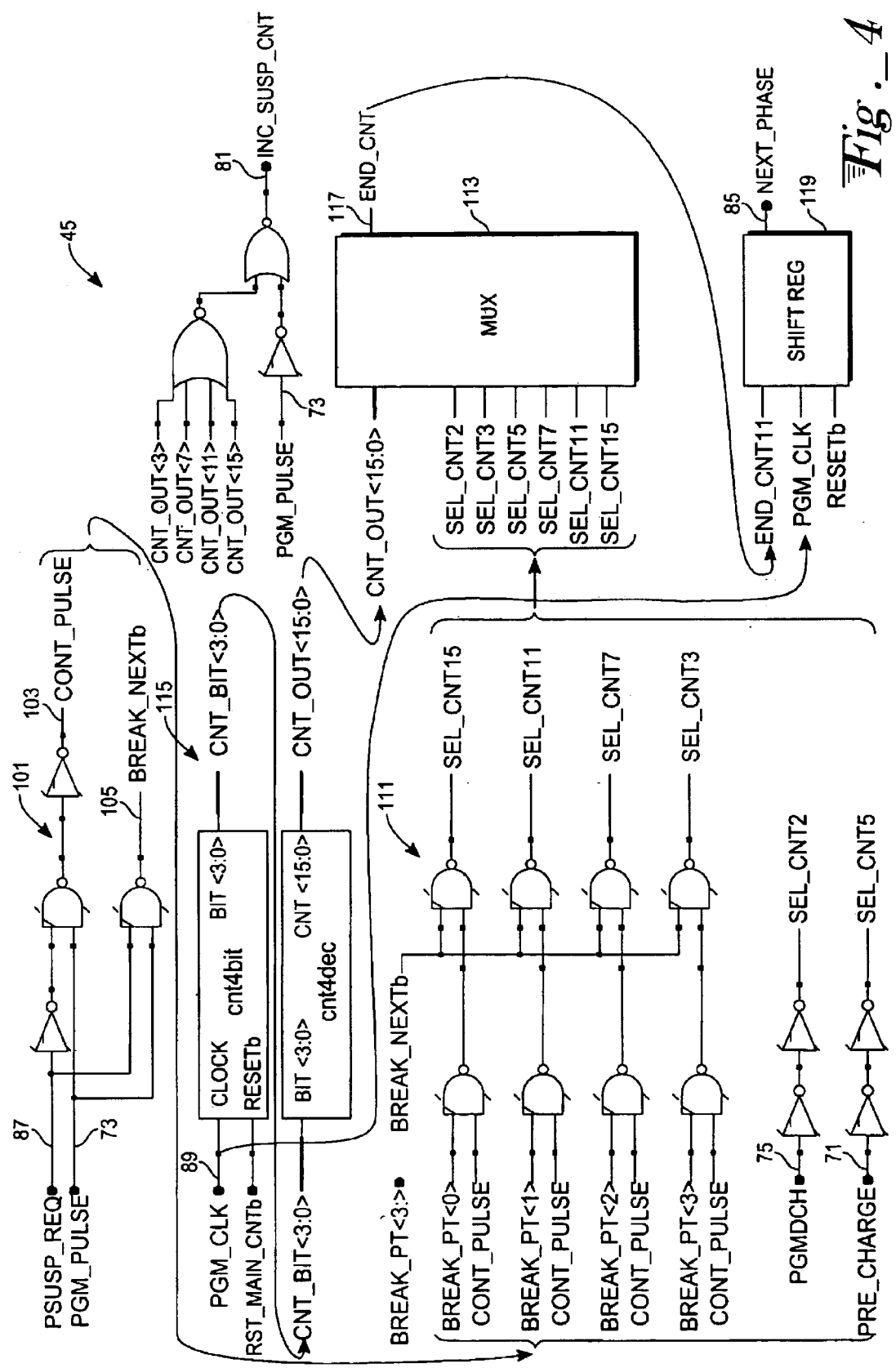
FIG. 4 is a logic diagram of a main timer shown in the block diagram of FIG. 3.

The operation is illustrated in more detail in the logic of main timer 45 seen in FIG. 4. This drawing illustrates an exemplary number of break points equal to 3. Counter module 115 includes a 4-bit binary counter and its decoder using internal programming clock PGM_CLK 89 as inputs to count. All three phases of the programming cycle, namely pre-charge phase, program pulse phase and program discharge phase use the same counter to keep track of respective durations. The 16 output signals CNT_OUT<15:0> are fed to the MUX 113 which is controlled by the select signals SEL_CNT2, SEL_CNT3, . . . , SEL_CNT15. The select signals choose the corresponding counts among CNT_OUT<15:0> as the end count of the current operating phase. Notice that the signal END-CNT 117 is fed into a shift register 119. Therefore, the actual duration of the current phase is actually equal to the timer count plus one. For example, the pre-charge phase controlled by signal PRE_CHARGE will activate MUX control signal SEL_CNT5. In turn, the MUX 113 will choose CNT_OUT<5> as END_CNT. However, the signal NEXT_PHASE 85 will not be asserted until one clock cycle later because of the shift register. The total time of the pre-charge phase in this example will be 6 clock cycles long. Similarly, the program discharge phase will have the duration of three clock cycles. The total phase length of program pulse is ended at CNT_OUT<15> having a duration of 16 clock cycles. The 3 pre-set break points can be represented by signals CNT_OUT<3>, CNT_OUT<7> and CNT_OUT<11>. Each has the time duration of 4, 8, and 12 cycles. They are all 4 cycles apart from each other. These counts are chosen as END_CNT by signals SEL_CNT15, SEL_CNT3, SEL_SNT7 and SEL_CNT11. Notice that signal SEL_CNT2 and SEL_CNT5 only respond to signal PGMDCH 75 (for program discharge) and PRE_CHARGE 71 (for precharge), respectively, but not PSUSP_REQ, these two phases will proceed to finish without interruption regardless of when the suspend command comes in. Logic gates 101 have input lines 73 and 87 to generate the CONT_PULSE on line 103 and the BREAK_NEXTb on line 105. Signal BREAK_NEXTb 105 responds to signal PSUSP_REQ and PGM_PULSE. PGM_PULSE can only be high during the program phase. BREAK_NEXTb activates all the break point selection signals as well as placing the finishing point selection signal high. In this way, when, and only when, the timer counts to one of the break points (CNT_OUT<3, 7, 11>) or the ending point (CNT_OUT<15>), the signal END_CNT 117 can be asserted and the phase of the program pulse can be stopped. Then suspend action occurs. Signal INC_SUSP_CNT is generated from the break point CNT_OUT<3, 7, 11, 15> and PGM_PULSE instructs the SUSPEND/RESUME COUNTER (FIG. 5) to recode the passing break points. SUSPEND/RESUME COUNTER returns the bus BREAK_PT<3.0> to tell how many cycles remain in the phase of program pulse. After the resume operation starts, CONT_PULSE 103 is activated by signal PSUSP_REQ going low. Logic unit 111 now decides what should be in the MUX selection signal to finish the remaining cycle of the program pulse from the state of bus BREAK_PT<3.0>. If the suspend operation occurred at the first break point CNT_OUT<3>, upon resume, the bus content of BREAK_PT<3.0> is 0010. In this case, SEL_CNT11 would be activated and the NEXT_PHASE will activated after 12 clock cycles. In case another suspend operation occurs at break point 3, CNT_OUT<11>, the BREAK_PT bus would return a value of 1000 for only 4 clock cycles remaining. In this way, no matter how many suspend operations may occur, the total time of phase program pulse adds up to 16 clock cycles.

Figure 5:
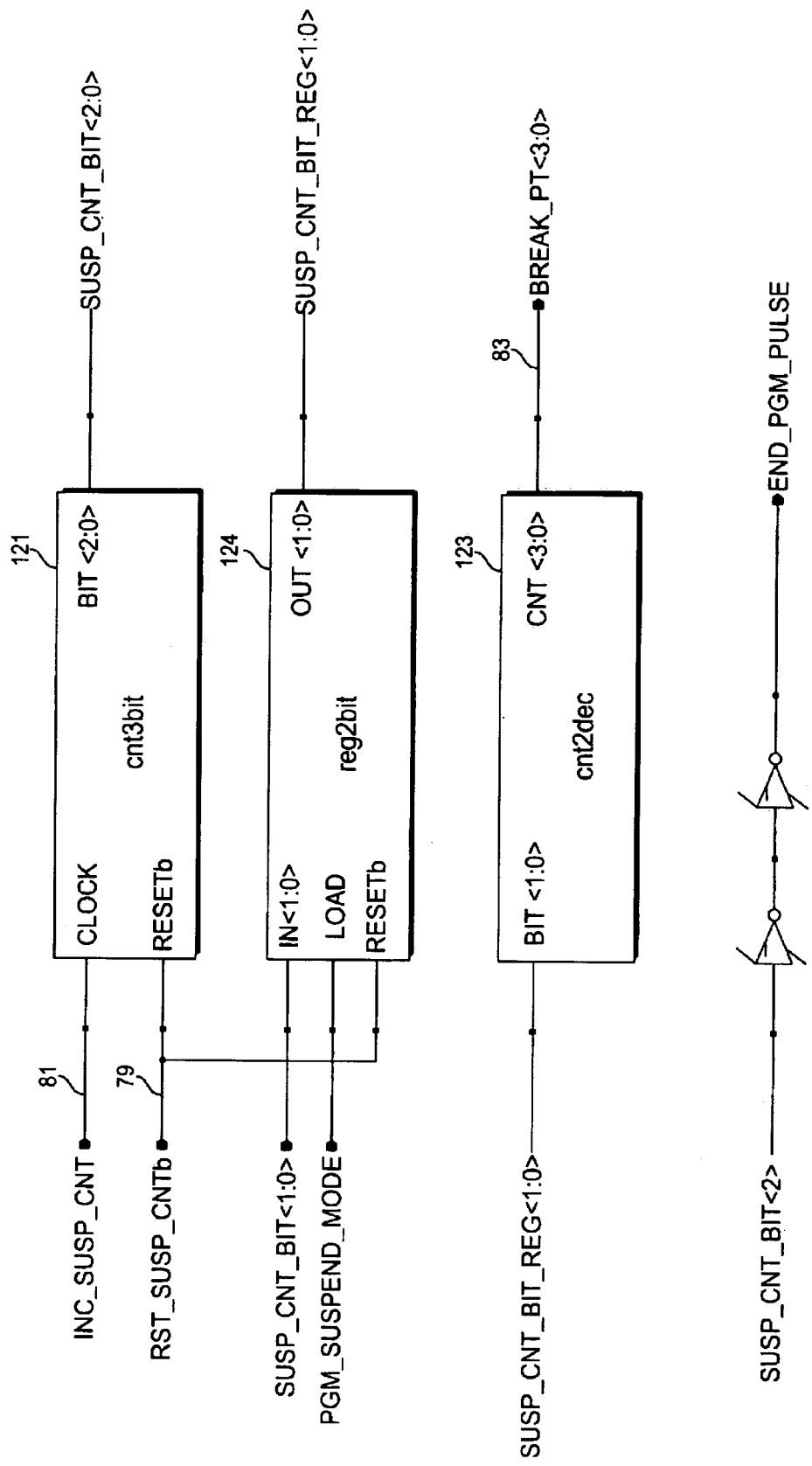
FIG. 5 is a logic diagram of a suspend-resume counter shown in the block diagram of FIG. 3.

FIG. 5 shows the logic associated with the suspend and resume counter. The logic contains a binary counter 121 and its decoder 123, and register 124. Counter 121 uses INC_SUSP_CNT as its clock, keeping track of the passing break points as well as the finishing point of the phase of the whole program pulse. Counter 121 and registers 124 are only reset after the flash memory device completes the entire PGM_PULSE phase. The outputs of this counter are loaded into the registers 124 by signal PGM_SUSPEND_MODE 77. Their outputs are decoded by decoder 123 to generate bus BREAK_PT<3.0>. If there is no suspend command received in the entire program operation, registers 124 are not loaded. Bus BREAK_PT<3.0> remains at its original value which is 0001, and the program pulse will end in 16 clock cycles (FIG. 4). Whenever a suspend operation occurs, registers 124 are updated with the passing break point information. This information generates the correct contents for the bus BREAK PT<3.0> which selects the correct remaining cycles for the program pulse upon a resume operation as mentioned above. Signal END_PGM_PULSE indicates the finish of the entire phase of the program pulse when the outputs of counter 121 reach the ending point (in this example when SUSP_CNT_BIT<2> goes high).

What is claimed is:

1. A method of programming a non-volatile memory array using suspend and resume commands comprising:
    (a) pre-defining a plurality of break points amidst a duration of a programming pulse of fixed duration;
    (b) beginning loading of a memory array with a program or data during the programming pulse;
    (c) issuing a suspend request during the programming pulse;
    (d) continuing loading of the memory array until a break point occurring after the suspend request, then suspending said loading;
    (e) issuing a resume request to again continue loading of the memory array;
    (f) repeating steps (c) to (e) until the programming pulse is complete.

2. The method of claim 1 wherein the number of break points exceeds the number of suspend requests.

3. The method of claim 1 further defined by beginning loading of the memory array coincidentally upon raising of a programming voltage at an onset of the programming pulse.

4. The method of claim 3 further defined by lowering the programming voltage after a break point occurs after the suspend request.

5. The method of claim 4 wherein the lowered programming voltage is a ground state voltage.

6. The method of claim 1 wherein the break points are uniformly spaced in the programming pulse.

7. The method of claim 1 wherein the break points are non-uniformly spaced in the programming pulse.

8. The method of claim 1 wherein the number of pre-defined break points in the programming pulse is at least three.

9. The method of claim 1 further defined by clocking an interval of non-loading of the memory array and maintaining loading for said fixed duration.

10. The method of claim 1 further defined by ramping up the programming pulse on a resume request prior to continuing the loading of said program or data.

11. The method of claim 10 further defined by ramping down the programming pulse on a break point occurring after a suspend request and simultaneously stopping loading of data.

12. A method of programming a non-volatile memory array using suspend and resume commands comprising:
    (a) pre-defining a plurality of break points relative to time amidst a duration of a programming pulse of fixed duration;
    (b) interrupting and resuming programming during the fixed duration upon interrupt and resume commands, the interrupting occurring at the next break point wherein programming is suspended, then resumes after a resume command;
    (c) counting the duration of the programming pulse only when programming is not suspended.

13. The method of claim 12 wherein the number of break points exceeds the number of suspend requests.

14. The method of claim 12 wherein the break points are uniformly spaced in the programming pulse.

15. The method of claim 12 wherein the break points are non-uniformly spaced in the programming pulse.

16. The method of claim 12 wherein the number of pre-defined break points in the programming pulse is at least three.

17. A method of programming a non-volatile memory array using suspend and resume commands comprising:
    (a) pre-defining a plurality of break points amidst a duration of a programming pulse of fixed
    (b) after ramping a voltage to a programming level, beginning loading of a memory array with a program or data during the programming pulse;
    (c) issuing a suspend request during the programming pulse;
    (d) continuing loading of the memory array until a break point occurring after the suspend request, then suspending said loading and then ramping down from the programming level to a low voltage level;
    (e) issuing a resume request at the low voltage level to again ramp up to the programming level and then continue loading of the memory array;
    (f) repeating steps (c) to (e) until the programming pulse is complete.

* * * * *

UNITED STATES PATENT AND TRADEMARK OFFICE
CERTIFICATE OF CORRECTION

PATENT NO. : 6,930,925 B2  Page 1 of 1
APPLICATION NO. : 10/685752
DATED : August 16, 2005
INVENTOR(S) : Jason Xiaojiang Guo and Fai Ching It is certified that error appears in the above-identified patent and that said Letters Patent is hereby corrected as shown below:

Column 5, lines 32-33 : "...bus BREAK PT<3.0> which selects the correct remaining…" should read:

--...bus BREAK_PT<3.0> which selects the correct remaining…-- .

Column 6, claim 17, lines 46-47: "...amidst a duration of a programming pulse of fixed" should read:

-- amidst a duration of a programming pulse of fixed duration;-- .

Signed and Sealed this

Twenty-sixth Day of December, 2006

JON W. DUDAS
*Director of the United States Patent and Trademark Office*